United States Patent [19]

Frances et al.

[11] 3,897,126

[45] July 29, 1975

[54] DOUBLE-SIDED PRINTED CIRCUIT CONNECTION BOARD WITH INSERTABLE MALE CONNECTOR PLUG

[76] Inventors: Andre L. Frances, 1, Allee des Ajoncs, 22300 Lannion; Jack E. Brochon, Rue Surcouf, 22700 Perros-Guirec, both of France

[22] Filed: May 14, 1974

[21] Appl. No.: 469,773

[30] Foreign Application Priority Data

June 8, 1973 France .............................. 73.21024

[52] U.S. Cl. ............................................ 339/17 LC

[51] Int. Cl.² .......................................... H05K 1/04

[58] Field of Search.... 339/17 R, 17 C, 17 L, 17 LM, 339/17 LC, 18 B, 18 C, 18 P, 75 MP, 176 MP

[56] References Cited

UNITED STATES PATENTS

| | | | |
|---|---|---|---|
| 3,217,208 | 11/1965 | Castro | 339/17 C X |
| 3,333,225 | 7/1967 | McNutt | 339/17 M |
| 3,660,726 | 5/1972 | Ammon | 339/18 B X |

*Primary Examiner*—Roy Lake

*Assistant Examiner*—E. F. Desmond

*Attorney, Agent, or Firm*—Abraham A. Saffitz

[57] ABSTRACT

A printed circuit connection board having equally spaced, parallel contact strips on each side extending from the same edge of the board and including two rows of holes in the board which are parallel and extend transversely to said strips, the strips on one side of the board leading to the row holes of nearer said edge of the board and the strips on the other side of the board leading to the holes of the other row and passing between holes of the first named row. Connections between the board and an insertable male conductor plug, separated by an insulating bar, are ensured by metal rods which are relatively short brads in the case of soldered connections between board and plug and relatively long pins in the case of wrapped connections between the same board and plug.

1 Claim, 7 Drawing Figures

DOUBLE-SIDED PRINTED CIRCUIT CONNECTION BOARD WITH INSERTABLE MALE CONNECTOR PLUG

The present invention concerns a printed circuit connection board with insertable male connector plug.

Effective utilisation of the surface area of a printed circuit board, bearing in mind the number of access points for input and output signals, as well as those for supplying power to its active components, often necessitates a number of contacts which cannot be provided by a single male connector plug or pin without reducing the surface area of these contacts or increasing the length of the connector which, in the second case, may lead artificially to doubling or trebling the surface area of the board.

Experience has shown, however, that, on the one hand, the width of the contacts cannot be reduced beyond a critical value without creating difficulties in regard to manufacture and use, and on the other hand that the now standardized dimensions of these boards cannot be increased without causing bonding of the female part of the connector, impairing the quality of the contacts.

Appreciable progress has been achieved by the use of "double-sided" boards, the conductor strips of which, instead of being arranged in staggered rows between one side and the other, are arranged two by two, opposite each other.

Male connector plugs or pins for printed circuit boards are known in the form of small prefabricated insulating bars inserted in the cards, the conductors or contacts whereof are manufactured by mechanical and galvanoplastic processes. However, within the Applicants' knowledge, at present there are no plugs or pins available of the kind usable in double-sided boards female connectors.

It is for this reason that "insertable" double-sided boards have appeared, one of the edges of which is cut away so as to expose a strip, provided on both sides with contacts produced by etching and then treated in the same way as the contacts on bars inserted in single-face boards.

These insertable double-sided boards have several comparatively serious drawbacks.

Treatment of the contact surfaces of the pins and subsequent checks necessitate immobilisation of the boards.

Manufacturing prices are increased since series runs are smaller.

Deterioration in service of the plugging contacts necessitates rejection of the board.

Above all, as experience has shown, male connectors are not of a perfectly uniform quality: sometimes they are of a mediocre standard; in any case, they are the cause of disputes with the manufactures of female connectors, it being difficult to assess their degree of reliability, since the manufacturers in question are unfamiliar with the manufacture of male connectors. Accordingly, insertable cards are little used.

The particular purpose of the present invention is to provide a prefabricated pin or plug for double-sided printed circuit boards which can be used in double-sided female connectors and eliminates the drawbacks indicated above.

The starting point for the invention is a double-sided printed circuit board with an insertable male connector plug or pin having, on both sides, printed parallel rectilinear conductor strips or contacts, uniformly spaced, arranged opposite one another on either face of the pin, terminating in inserts, drilled with coaxial holes, in the pin, arranged in two parallel lines at the plugging edge and separated from each other by gaps *d*, the pin being fixed to the board by suitable mechanical means in such a manner that the pin covers one side of the board over a certain width.

Printed circuit boards of such type are doubtless known but they do not automatically ensure the possibility of prefabricating on the one hand the pins and on the other hand the soldered connections between pins and boards. Furthermore, such boards are not generally designed to permit connections by wrapping between boards and pins.

For this purpose, a board in accordance with the invention of the above-defined type is characterized in that the printed circuits of the board terminate in inserts with the same interaxial spacing as those of the pin, drilled with coaxial holes in the board, arranged in two lines, parallel with the edge of the board and spaced one from another at the same distance *d*, so that the board is separated from the pin by an intermediate insulating strip, drilled with holes following the same pattern as on the pin and the board, and in that board, bar and pin are assembled with similar holes facing each other, so that they can be traversed by rectilinear conductor rods, arranged perpendicularly to the board, and permitting the necessary connections to be made between board and pin, these rods being provided, on the side of the pin opposite the board with soldered tips ensuring connection of the rods with the inserts on either side of the pin.

It is obvious that by this means the targets set by the invention are achieved, since on the one hand insertion of the metal rods in the pin can be automatic and on the other hand the soldered tips of these rods on the pin can be made by dip soldering.

The length of the metal rods is matched to suit the type of connections to be made between board and pin. If the connections are soldered, the board according to the invention is such that the said rods are relatively short brads, provided, on the side of the board opposite the pin, with soldered tips ensuring connection of the rods with the inserts on either side of the board at which the printed strips on the latter terminate.

Thus, here again, the soldered connections can be made by dip soldering (it being possible to use this process also for soldering component mounts or components on the card).

If the connections between board and pin are made by wrapping, the board according to the invention is such that the said rods are relatively long pins.

The invention will be more clearly understood on reading the following description of preferred exemplary embodiments, and on examining the attached drawings in which FIG. 1 is a front view (front side) of the assembly in accordance with the invention of a printed circuit board and a pin attached to this board (first form of embodiment for soldered connections between board and pin);

Figure 1:
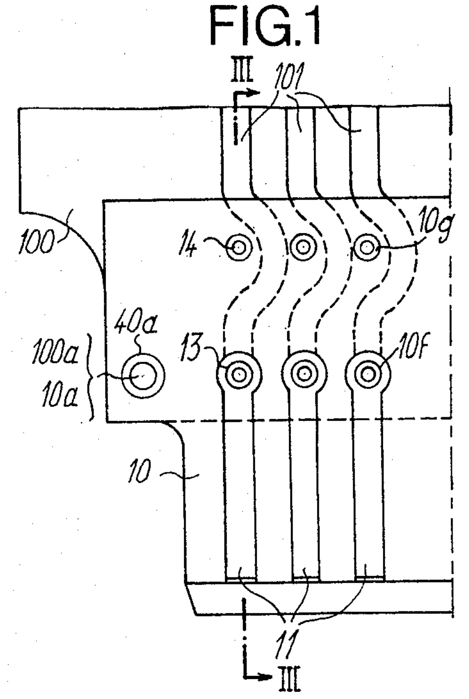
Figure 3:
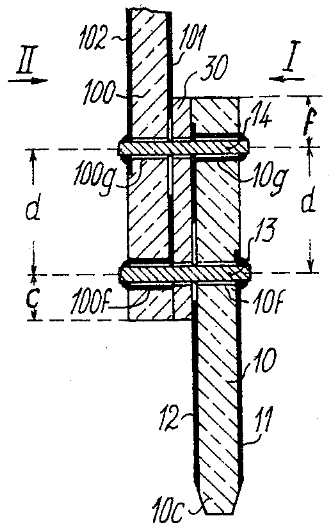
FIG. 3 is a cross-sectional view (along the line III-III of FIG. 1) of the same assembly as shown in said figure.
Figure 2:
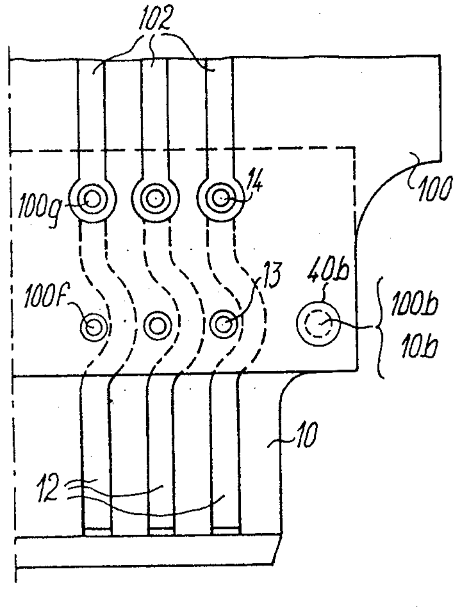
FIG. 2 is a back view (rear side) of the same assembly as shown in FIG. 1.

In FIGS. 1 to 3, a double-side printed circuit board 100 is shown and a male connector plug 10, which will be designated "pin" for greater simplicity, board and pin being both made, e.g. of a laminated material such as epoxy-glass.

These figures show that the board 100 has conductor strips 101, 102 respectively denoted as front and back, these strips being arranged equidistant from each other on each side of the board, and in pairs, face to face, from one side of the board to the other.

On board 100, the back strips 102 terminate in inserts drilled with coaxial holes 100g passing through the board and arranged in a line parallel to and at a distance $c + d$ from the adjacent edge of the board. The front strips 101 terminate first in sections offset laterally by half the interaxial spacing of the strips, to pass round the holes 100*g*, followed by inserts drilled with coaxial holes 100*f*, passing through the board and arranged in a line parallel to the said board edge, at a distance $c$ from the latter. The holes 100*f* are metallized (or each is equipped with a tubular bush) whereas the holes 100*g* are not so treated.

Finally, two attaching holes 100*a*, 100*b* are drilled in the card which will be considered later.

The same FIGS. 1 to 3 show that the pin 10 has conductor strips 11, 12 respectively described as "front" and "back", which will be referred to as "contacts" for greater simplicity, these contacts also facing each other in pairs on each side of the pin, arranged regularly on each side, their interaxial spacing being the same as that of the conductor strips of the board.

On the pin 10, the front contacts 11 terminate in inserts, drilled with coaxial holes 10*f* passing through the pin and aligned at a distance $f + d$ from the plugging or insertion edge of the pin. The back contacts 12 terminate first in sections offset laterally by half the interaxial distance to pass round the holes 10*f*, followed by inserts drilled with coaxial holes 10*g*, passing through the pin and aligned at a distance $f$ from the said plugging edge of the pin. The holes 10*g* are metallized (or each is equipped with a tubular bush) whereas the holes 10*f* are not so treated.

Finally, two attaching holes 10*a*, 10*b* are drilled in the pin in such a way that all the matching holes in the board and pin respectively can be brought into line in pairs, facing each other. The pin also has a double-bevelled free edge 10*c*.

A small intermediate bar 30, e.g. made of a thermosetting plastic material, e.g. of 0.5 mm thickness, designed to insulate the card and pin electrically from each other, is drilled with holes corresponding to the holes 100*f*, 100*g*, 100*a*, 100*b* in the board and 10*f*, 10*g*, 10*a*, 10*b* in the pin.

The holes 10*f* in the pin and 100*f* in the board are freely traversed by the brads 13, and the holes 10*g* in the pin and 100*g* in the card by the brads 14. The brads 13, 14 are each first soldered, e.g. during the manufacture of the connector, at the ends projecting from the front side of the pin 10, each brad 13 to the end insert of a contact 11 on the pin, each brad 14 to the end insert of a contact 12 on the pin by means of the metallizing round the hole 10*g* (or a rivet inserted in this hole). The brads 13, 14 are each subsequently soldered, e.g. during the assembly of the prefabricated pin, equipped with its soldered brads as just described, on a printed circuit board equipped with all its board components, intermediate bar and pin being then assembled in such a manner that the brads pass through the holes in the bar and the board in tubular rivets 40*a*, 40*b*, passing into corresponding attaching holes in the three elements; each brad 14 is then soldered to the end insert of a strip 101 on the card by means of metallizing round the hole 100*f* (or a rivet inserted in this hole).

Figure 4:
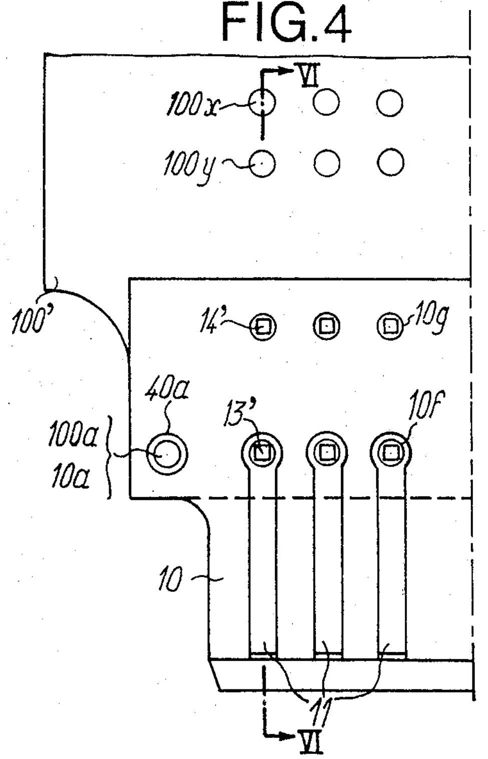
FIGS. 4 to 6 are views respectively similar to those of FIGS. 1 to 3 (second form of embodiment for wrapped connections between board and pin)
Figure 5:
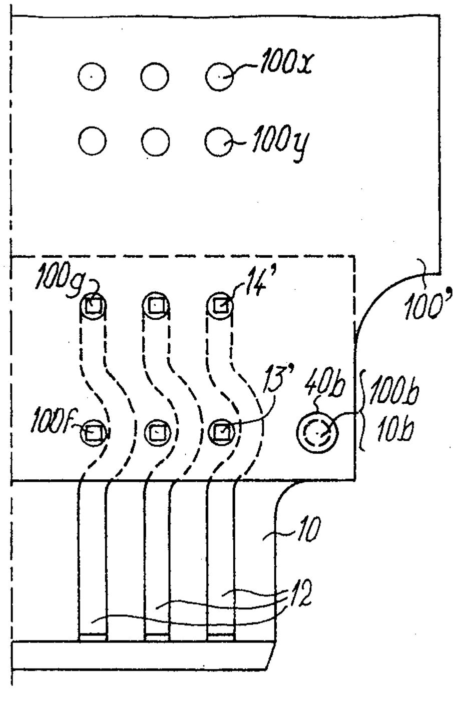

FIGS. 4 and 5 show the assembly of a double-sided printed circuit board 100 and a pin 10 in a case differing from the preceding, in which the connections between pin and board are made by fine wire-wrapping instead of by soldering.

Figure 6:
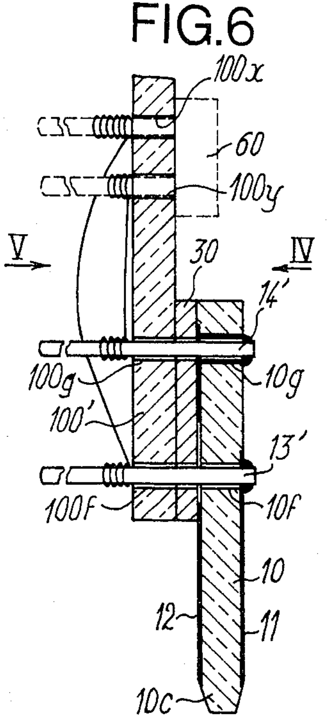

It will be seen by comparing FIGS. 4 to 6 with FIGS. 1 to 3 respectively that the embodiment of the pin is identical with that in the preceding case, except that the brads 13, 14 are replaced by pins 13′, 14′, substantially longer than the brads (e.g. of the order of 15 mm instead of 2 mm) and normally of square cross-section (0.8 mm × 0.8 mm). On the other hand, in regard to the board, the following differences will be noted:

The board no longer has front or back conductor strips. Consequently, the holes 100*f* no longer require to be metallized.

On the contrary, the board has lines of holes such as 100*x*, 100*y*, permitting the insertion of component mounts or components such as 60, by pins which also project at the rear of the board. As an example, two wrapped connections between board and pin are shown in FIG. 6.

Figure 7:
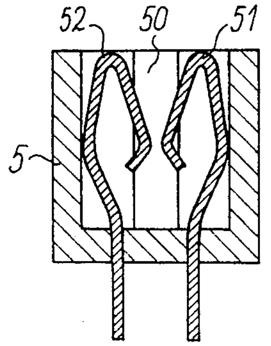
FIG. 7 is a cross-sectional view of a female connector plug designed to coact with the pin in accordance with the invention.

Although it forms no part of the invention, it can be stated that in the case of a double-sided board, a female connector (see FIG. 7) consists of an elongated body 5, having a longitudinal axial groove 50 designed to receive the bevelled edge 10*c* of the pin 10 and transverse grooves in pairs, facing each other and housing the conductors, bent into blades, 51, 52, designed to coact respectively with the contacts 11, 12 on the pin, the flexibility of the said blades ensuring gripping of the edge of the pin 10 as well as contact with the contacts of the latter.

The process for manufacturing male connector plugs or pins in accordance with the invention normally consists of the following stages:

At the side of each pin, two series of holes are drilled for contacts as well as the two attaching holes. If necessary, the holes are metallized.

Two series of contacts are freed by etching on the two sides of the plate, at the site of each pin, which are connected at the top by a transverse strip known as a "feeder" itself connected to a common strip supplying all the feeders with current, in preparation for the following stage of electroplating.

The copperplated parts of the plate are galvanically plated with a coating of a suitable metal (nickel), (gold) along the length of the plugging edge.

The plate is cut along the contours of the finished pins, eliminating the feeders.

One of the edges of each pin is double-bevelled.

Brads or pins are inserted in the holes of each pin, some pins being provided, if necessary, with bushings to replace metallizing of the corresponding holes in the pin and they are soldered from the front side of the pin by dipping.

Having available a stock of such prefabricated pins as well as intermediate bars and rivets, the process of fixing a pin on a printed circuit board is thus reduced to the following stages:

Two attaching holes are drilled in the board.

Board, bar and pins are assembled and combined by means of two rivets. Finally, connections are made between board and pin; either by soldering from the rear of the passage by dip soldering (in one pass which is usually the same as that for soldering the components mounts or components to the conductor strips on the cards); or by fine wire-wrapping between pins 13', 14' and pins 100*x*, 100*g*.

What we claim is:

1. A connecting device comprising:

a rectangular board having at its upper part a plurality of rows of holes parallel to the upper edge of said board and at its lower part two rows of holes parallel to said upper edge;

first conductive pins inserted in the holes of the upper part of the board and projecting from the front side of said board which are adapted at their rear ends for connecting electrical components set near the back side of said board by soldering the terminals of said components to said pins;

a printed circuit connecting plate which is parallel to said board and faces the lower part thereof, said printed circuit connecting plate having equally spaced parallel conductive strips on each side extending from the lower edge of said plate and which are drilled at their ends remote from said edge with holes forming two spaced rows of holes opposite to the rows of holes of the lower part of said board;

said printed circuit connecting plate having a part extending below the lower edge of said board;

an insulating plate;

said insulating plate being sandwiched between said lower part of said board and said printed circuit plate which is drilled with holes having the same pattern as on said printed circuit connecting plate and said rectangular board;

second conductive pins adapted for passing through selected associated holes of said board, said insulating plate, and said printed circuit connecting plate perpendicularly with respect to said connecting device and which are soldered with corresponding conductive strips of said printed circuit connecting plate and which project from the front side of the lower part of the board; and, conductive wires wrapped around projecting parts of said first and second pins adapted for connecting a selected first pin and a selected second pin so that a selected conductive strip of said printed circuit plate is connected to a terminal of a selected component of said connecting device.

* * * * *